US008586963B2

(12) United States Patent
Tansu et al.

(10) Patent No.: US 8,586,963 B2
(45) Date of Patent: Nov. 19, 2013

(54) SEMICONDUCTOR LIGHT-EMITTING DEVICES HAVING CONCAVE MICROSTRUCTURES PROVIDING IMPROVED LIGHT EXTRACTION EFFICIENCY AND METHOD FOR PRODUCING SAME

(75) Inventors: Nelson Tansu, Bethlehem, PA (US); James F. Gilchrist, Allentown, PA (US); Yik-Khoon Ee, Mountain View, CA (US); Pisist Kumnorkaew, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 350 days.

(21) Appl. No.: 12/963,098

(22) Filed: Dec. 8, 2010

(65) Prior Publication Data

US 2011/0155999 A1    Jun. 30, 2011

Related U.S. Application Data

(60) Provisional application No. 61/267,523, filed on Dec. 8, 2009.

(51) Int. Cl.
*H01L 33/24* (2010.01)

(52) U.S. Cl.
USPC ............. 257/13; 257/95; 257/98; 257/E33.07

(58) Field of Classification Search
USPC ..................... 257/E33.034, E33.07
See application file for complete search history.

(56) References Cited

U.S. PATENT DOCUMENTS 6,977,952 B2    12/2005   Yamaguchi et al.
7,026,659 B2    4/2006    Slater, Jr. et al.
7,053,420 B2    5/2006    Tadatomo et al.
7,420,222 B2    9/2008    Slater, Jr. et al.
7,480,322 B2    1/2009    Feezell et al.
7,528,422 B2    5/2009    Murphy
7,547,908 B2    6/2009    Grillot et al.
8,076,667 B2 *  12/2011   Tansu et al. ............... 257/13

(Continued)

FOREIGN PATENT DOCUMENTS

WO    WO 2007/138657 A1    12/2007
WO    WO 2008/045337 A1    4/2008

OTHER PUBLICATIONS

Ee et al., Optics Express, vol. 17, No. 16, pp. 13747-13757 (Aug. 3, 2009).

(Continued)

*Primary Examiner* — Stephen W Smoot
(74) *Attorney, Agent, or Firm* — Saul Ewing LLP

(57) ABSTRACT

A conventional semiconductor LED is modified to include a microlens layer over its light-emitting surface. The LED may have an active layer including at least one quantum well layer of InGaN and GaN. The microlens layer includes a plurality of concave microstructures that cause light rays emanating from the LED to diffuse outwardly, leading to an increase in the light extraction efficiency of the LED. The concave microstructures may be arranged in a substantially uniform array, such as a close-packed hexagonal array. The microlens layer is preferably constructed of curable material, such as polydimethylsiloxane (PDMS), and is formed by soft-lithography imprinting by contacting fluid material of the microlens layer with a template bearing a monolayer of homogeneous microsphere crystals, to cause concave impressions, and then curing the material to fix the concave microstructures in the microlens layer and provide relatively uniform surface roughness.

14 Claims, 5 Drawing Sheets

(56) References Cited

U.S. PATENT DOCUMENTS

| | | |
|---|---|---|
| 2006/0078031 A1 | 4/2006 | Govorkov et al. |
| 2007/0262293 A1 | 11/2007 | Fujikura |
| 2008/0303047 A1* | 12/2008 | Shen et al. ............... 257/98 |
| 2009/0315013 A1 | 12/2009 | Tansu et al. |

OTHER PUBLICATIONS

Huh, C., J. Applied Physics, vol. 93, No. 11, p. 9383-9385 (2003).
Fujii et al., Applied Physics Letters, vol. 84, No. 6, pp. 885-887 (2004).
Lin et al., IEEE Photonics Technology Letters, vol. 17, No. 10, pp. 2038-2040 (2005).
Lee et al., phys. stat. sol. (c), vol. 4, No. 7, pp. 2625-2628 (2007).
Kim et al., Electronics Letters, vol. 41, No. 20 (2005).
McGroddy et al., Applied Physics Letters, vol. 93, pp. 103502 (2008).
Choi et al., Applied Physics Letters, vol. 84, No. 13, pp. 2253-2255 (2004).
Xi et al., IEEE Photonics Technology Letters, vol. 18, No. 22, pp. 2347-2349 (2006).
Kim et al., CTuI1.pdf, Optical Society of America (2006).
Fischer et al., CTuI2.pdf; Optical Society of America (2007).
Ee et al., Applied Physics Letters, 91, 221107-221109 (2007).
Kumnorkaew et al., Langmuir, 24, p. 12150-12157 (2008).
Ee et al., IEEE Journal of Selected Topics in Quantum Electronics, vol. 15, No. 4, pp. 1218-1225 (2009).

* cited by examiner

SEMICONDUCTOR LIGHT-EMITTING DEVICES HAVING CONCAVE MICROSTRUCTURES PROVIDING IMPROVED LIGHT EXTRACTION EFFICIENCY AND METHOD FOR PRODUCING SAME

CROSS-REFERENCE TO RELATED APPLICATIONS

This application claims the benefit of priority under 35 U.S.C. §119(e) of U.S. Provisional Patent Application No. 61/267,523, filed Dec. 8, 2009, the entire disclosure of which is hereby incorporated herein by reference.

STATEMENT REGARDING FEDERALLY-SPONSORED RESEARCH OR DEVELOPMENT

This invention was made with government support under U.S. National Science Foundation—ECCS Award #0701421, US National Science Foundation—CBET Award #0828426, and US Department of Energy—NETL (DE-FC26-08NT01581). The government has certain rights in the invention.

FIELD OF THE INVENTION

The present invention relates generally to semiconductor light-emitting devices (LEDs), and more particularly to a semiconductor LED having improved light extraction efficiency, and a method for making same.

DISCUSSION OF RELATED ART

A semiconductor LED is a semiconductor device that emits incoherent narrow-spectrum light when electrically biased in the forward direction of a p-n junction. This effect is a form of electroluminescence.

A semiconductor LED typically comprises a small area source, often with extra optics added to the chip that shapes its radiation pattern. Color of emitted light depends upon semiconductor material composition and can be infrared, visible, or near-ultraviolet. The LED can comprise a chip of semiconducting material impregnated or doped with impurities to create the p-n junction. Charge-carriers—electrons and holes—flow into the junction from electrodes with different voltages. When an electron meets a hole, it falls into a lower energy level and releases energy in the form of a photon (light) causing current flow from the p-side, or anode, to the n-side, or cathode. The wavelength of the light emitted, and hence its color, depends on the band gap energy of the materials forming the p-n junction.

The refractive index of an LED package material should match the index of the semiconductor, otherwise produced light will be partially reflected back into the semiconductor, where it may be absorbed and turned into efficiency-lowering heat. Efficiency-lowering reflection also occurs at the surface of the package if the LED is coupled to a medium with a different refractive index such as a glass fiber or air. The external quantum efficiency ($\eta_{EQE}$) of LEDs can be expressed as the product of current injection efficiency ($\eta_{inj}$), radiative efficiency ($\eta_{rad}$), and light extraction efficiency ($\eta_{extraction}$). The light extraction efficiency is defined as the fraction of photons generated in the active region of semiconductor that escapes into free space. In addition to challenges in achieving high radiative efficiency and current injection efficiency in InGaN quantum well (QW) LEDs, light extraction efficiency optimization in nitride-based LEDs is important for achieving high-efficiency devices. Unfortunately, the refractive index difference of GaN (n=2.5) is relatively large compared to air (n=1). The large mismatch in refractive indices results in a narrow escape cone of only 23.5° with escape probability of only 4% from the top surface of the LED devices, with the rest of the optical power trapped within the semiconductor.

Various approaches have been pursued to overcome the light extraction limitation in nitride LEDs. One approach has been to roughen the top surface emission area of the LEDs, which tends to lead to enhanced scattering of light generated from the active region at the roughened GaN/air interface. The surface roughening technique may be accomplished by using wet etching or photochemical etching. However, the roughness obtained using these methods varies, thus leading to variation in the light extraction efficiency improvement of the LEDs across the wafer sample. Another approach has been to roughen the mesa sidewalls of the LEDs using photochemical etching. Similarly, such etching results in a surface of the mesa sidewalls that is non-uniform. Another approach to increase the light extraction efficiency of the LEDs has been to use an oblique mesa sidewall, which can be achieved by using reflowed photoresist and adjusting the flow of $CF_4$ gas during the dry etch process. However, the improvement of the light extraction efficiency in LED employing oblique mesa sidewall was limited to the areas in the sidewall regions only. Photonic crystal structures can also be utilized to enhance the light extraction efficiency of LEDs, but this approach requires the use of electron beam or complex laser holographic lithography due to the small dimensions of the photonic crystal structures. Other approaches to improve light extraction efficiency in III-Nitride LEDs have included a sapphire microlens approach (involving either a sapphire-etching process or micromachining), a nano-pyramid approach (involving electron-beam lithography), and a grading approach (involving refractive indices between GaN/air interface with planar materials). The disadvantages of surface roughening are related to difficulty in controlling the process as well as in achieving good roughness uniformity. The photonic crystal and nano-pyramid approaches require costly e-beam lithography, which are not applicable for large scale production of nitride LEDs. Further, the use of a graded refractive index material will not lead to an increase in the light escape cone, rather this approach is only limited to reduction in Fresnel reflection.

Yet another approach for significantly enhancing the light extraction efficiency of III-Nitride LEDs involves fabricating $SiO_2$/polystyrene (PS) microlens arrays. This approach is described in detail in U.S. patent application Ser. No. 12/520, 619, the entire disclosure of which is hereby incorporated herein by reference, which is presently commonly owned herewith. However, this approach does not sufficiently increase the light escape cone, or provide for a self-focusing effect in a far-field pattern.

There remains a continued need for enhanced, inexpensive and uniform LED light-extraction efficiency.

SUMMARY

The present invention provides a light emitting device having light extraction efficiency that is improved by the addition of a microlens layer having a plurality of concave microstructures. The microstructures enhance light scattering from the LED out to free space, and thus provide a significant increase in the light escape cone. In addition, the present invention provides for an improved self-focusing effect in the far field pattern.

In one exemplary embodiment, a light emitting device includes at least one n-type layer, at least one p-type layer disposed adjacent said at least one n-type layer; and a microlens layer disposed adjacent said at least one p-type layer, the microlens layer comprising a plurality of concave microstructures.

In another embodiment, a light emitting device includes a substrate, a first contact layer disposed over said substrate, said first contact layer comprising a GaN-based material having a first conduction type, an active layer disposed over said first contact layer, said active layer comprising at least one GaN-based material, a second contact layer disposed over said active layer, said second contact layer comprising a GaN-based material having a second conduction type opposite to the first conduction type, and a microlens layer disposed over said second contact layer, said microlens layer comprising a plurality of concave microstructures.

A low cost and scalable method for improving the light extraction efficiency of the LEDs is provided also. The method involves use of a microsphere array as a template to create concave microstructures in a layer on top of the LED. Accordingly, an exemplary method for improving light extraction efficiency of a light emitting device includes: providing a light emitting device having a top emission surface; depositing a layer of fluid curable material on the top emission surface; imprinting the layer of fluid material by contacting the layer of fluid material with a template comprising a plurality of microspheres; heat treating the imprinted layer of fluid material to provide a microlens layer of cured material comprising a plurality of concave microstructures; and removing the template from contact with the microlens layer of cured material.

Another embodiment is an optoelectronic device comprising: a multilayer semiconductor structure comprising a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage; and a microlens layer disposed over the multilayer semiconductor, said microlens layer comprising a plurality of concave microstructures.

In another embodiment, the present invention provides a method for making an optoelectronic device, the method comprising: providing a multilayer semiconductor structure comprising a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage; and providing a microlens layer comprising a plurality of concave microstructures over the multilayer semiconductor.

In yet another embodiment, the present invention provides a method for generating optical emission from an optoelectronic device, the method comprising: providing a GaN layer and an active region, the active region comprising at least one quantum well layer of InGaN and GaN, wherein the electron quantum well layers and hole quantum well layer form a first quantum well stage, and wherein the active region comprises a plurality of quantum well stages adjacent to each other having the same structure as the first quantum well stage; providing a microlens layer comprising a plurality of concave microstructures over the active region; and exciting the active region to produce optical emission through the microlens layer.

BRIEF SUMMARY OF DRAWINGS

The present invention will now be described by way of example with reference to the following drawings in which.

DETAILED DESCRIPTION

LED light extraction efficiency is the portion of emitted electromagnetic radiation that is transmitted usable for human vision. It is a ratio of emitted luminous flux to radiant flux. The present invention relates to an LED with improved light extraction efficiency.

An LED can comprise a chip of semiconducting material impregnated or doped with impurities to create a p-n junction. Current flows from the p-side or anode, to the n-side or cathode, but not in the reverse direction. Charge carriers—electrons and holes—flow into the junction from electrodes with different voltages. When an electron meets a hole, it falls into a lower energy level and releases energy in the form of a photon.

A quantum well is an LED potential well. The term "quantum well" or "QW" used herein refers to a thin-layer structure comprising alternate layers consisting of a first semiconductor layer with a thickness smaller than the de Broglie wavelength of about 200 Å. to 300 Å with respect to electrons or holes and at least a second semiconductor layer with a band gap greater than that of the first semiconductor layer. A "substrate" is an underlying template or substratum can such as a sapphire template, GaN substrate, a Si substrate, SiC substrate or ZnO substrate.

A QW structure can be formed by sandwiching a semiconductor thin layer of a narrow band gap between semiconductor layers of a large band gap. If a single semiconductor thin layer constitutes a quantum well for both electrons and holes, the quantum well is called a type I quantum well. In this case, the semiconductor layer of a narrow band gap is called a well layer, and the semiconductor layers of a large band gap are called barrier layers. A type I multi-quantum well structure can be formed by alternately laminating semiconductor layers of narrow and broad band gaps. A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers.

Generally, the present invention involves adding to a semiconductor light emitting device a microlens layer providing an applied surface texture that improves light extraction efficiency of an LED.

Figure 1:
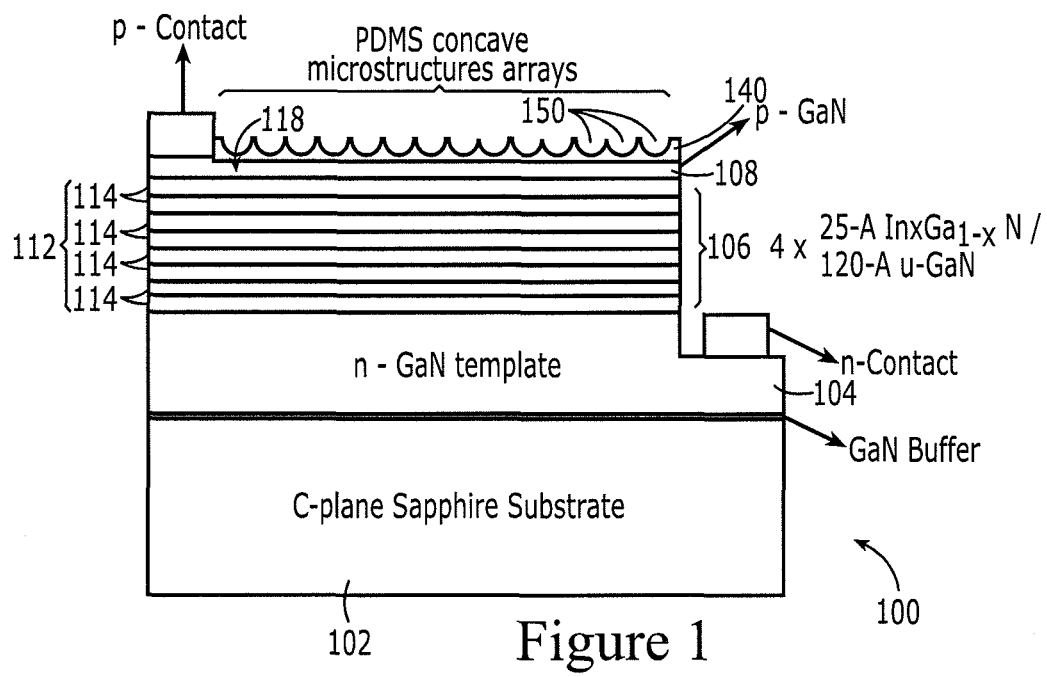
FIG. 1 is a diagrammatic representation of a semiconductor LED having concave microstructures in accordance with an exemplary embodiment of the present invention.

Referring now to FIG. 1, an exemplary semiconductor LED 100 having concave microstructures 150 is shown. As is conventional, the LED 100 includes a substrate 102 and a first contact layer 104 having a first conduction type disposed over the substrate 102. In this example, the first contact layer 104 is an n-type layer and comprises a GaN-based material. The LED 100 further includes an active layer 106 disposed over the first contact layer 104. In this example, the active layer includes at least one GaN-based material, such as InGaN. The LED 100 further includes a second contact layer 108 having a second conduction type opposite to the first conduction type disposed over the active layer 106. In this example, the second contact layer 108 is a p-type layer comprising a GaN-based material. Further, in this example, the LED 100 is a multilayer semiconductor structure including (i) a GaN layer and (ii) an active region 112 including at least one quantum well layer of InGaN and GaN, wherein the electron quantum well layers and hole quantum well layer form a first quantum well stage 114, and wherein the active region 112 comprises a plurality of quantum well stages adjacent to each other having the same structure as the first quantum well stage. Thus, the quantum well includes an active region having GaN layer sandwiched between two InGaN layers and has a top emission surface 118.

Consistent with the present invention, the exemplary LED 100 further includes a microlens layer 140 disposed over the second contact layer 108. The microlens layer 140 includes a plurality of concave microstructures 150, and is disposed on the top emission surface 118 of the LED 100. The concave microstructures 150 allow light rays emanating from the LED 100 to diffuse outwardly, leading to an increase in the light extraction efficiency of the LED 100.

Figure 5:
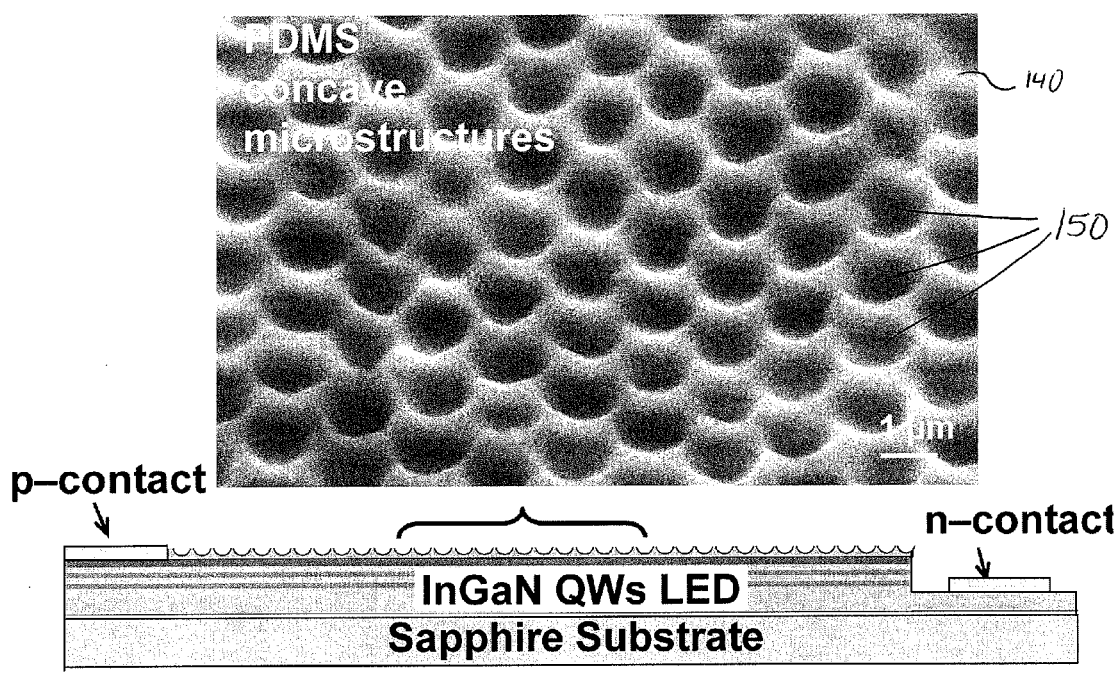
FIG. 5 is a scanning electron microscopy image showing the concave microstructures of the LED structure of FIG. 1.

The plurality of concave microstructures 150 are preferably arranged in a substantially uniform array, such as a close-packed hexagonal array, as best shown in the scanning electron microscopy image of FIG. 5. Each of the plurality of concave microstructures preferably has a maximum diameter measuring within a range from about 0.05 up to about 4 microns, and most preferably from about 0.5 to about 1.0 micron. The microlens layer 140 is constructed of a curable material, and is preferably constructed of polydimethylsiloxane (PDMS).

Further, the present invention provides a particular method of manufacturing a semiconductor light emitting device including a microlens layer 140 that provides for relatively uniform surface roughness, which will ensure high yield in manufacturing. In one embodiment, the method involves forming the microlens layer by imprinting a layer of fluid (uncured) material, such as PDMS, with a template that includes a plurality of microsphere crystals. The individual microsphere crystals form complementary concave impressions in the layer. Once formed, the microlens layer is cured to fix the concave microstructures. An exemplary imprinting method is described below with reference to FIG. 2.

Figure 2:
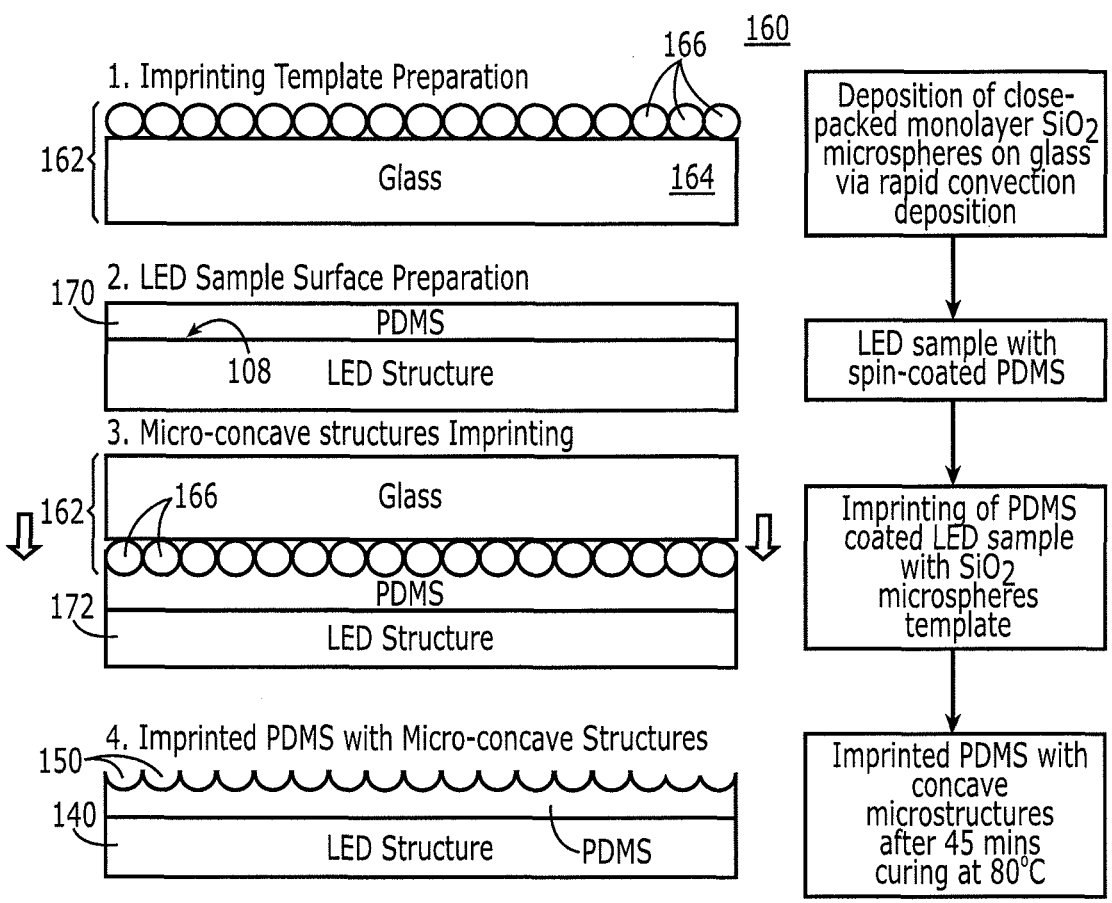
FIG. 2 is a process flow schematic illustrating an exemplary method for preparing the semiconductor LED of FIG. 1.

Referring now to FIG. 2, a process flow schematic 160 illustrating an exemplary method for preparing an LED 100 including concave microstructures is shown. The method involves preparing an imprinting template 162 comprising a substrate 164 and a plurality of microspheres 166 fixed to the substrate 162. Preferably the plurality of microspheres 164 are homogeneous and are arranged as a monolayer of close-packed microspheres.

Figure 3:
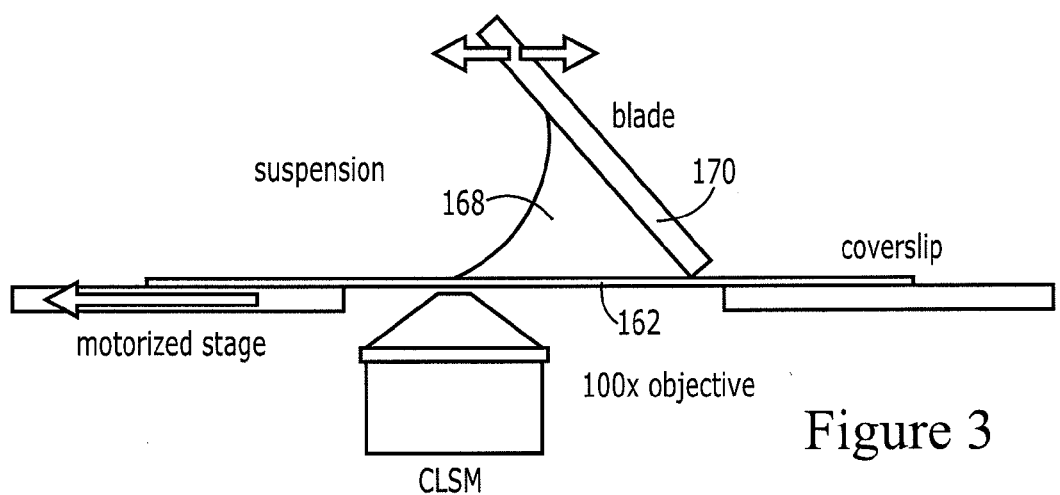
FIG. 3 is a schematic illustrating preparation of a microsphere template for use in the process shown in FIG. 2.

The template may be prepared by depositing a monolayer of close-packed microspheres onto the substrate, such as a glass substrate. In a preferred embodiment, $SiO_2$ microspheres 166 are used, and are deposited by rapid convection deposition. This technique may involve providing a colloidal suspension 168 of $SiO_2$ microspheres, providing a deposition blade 170 above the substrate 162, depositing the colloidal suspension on the substrate; and sweeping the deposition blade over the substrate to distribute the $SiO_2$ over the substrate, as illustrated schematically in FIG. 3. The speed may be varied to ensure proper deposition of a monolayer. For example, for a deposition blade angle of 25 degree (and for 1-micron diameter $SiO_2$ sphere, the glass plate may be swept across the substrate at a speed of 45 µm s. By way of alternative example, for a monolayer deposition of 0.5 µm $SiO_2$ microspheres and 1.0 µm $SiO_2$ microspheres, the optimal deposition speed using a hydrophilic blade at an inclination angle of 80 degrees may be 65 µm/s and 60 µm/s, respectively. Suitable $SiO_2$ microspheres can be prepared for example, by hydrolysis of tetraethoxysilane or, by a sol gel process or by spray drying a colloidal silica gel. Suitable size spheres can be in the range from 0.05 microns up to 4 microns in diameter, preferably 0.1 micron to 2 microns. Suitable $SiO_2$ microspheres are commercially available from a variety of sources, such as Bangs Laboratories, Inc., 9025 Technology Drive, Fishers, Ind. 46038-2886 and are available in quantities with a standard size deviation of less than 1%. The $SiO_2$ microspheres can be deposited in a suspension media such as DI-water. The $SiO_2$ suspension may be optimized for 13% volume fraction in DI-water.

Figure 4:
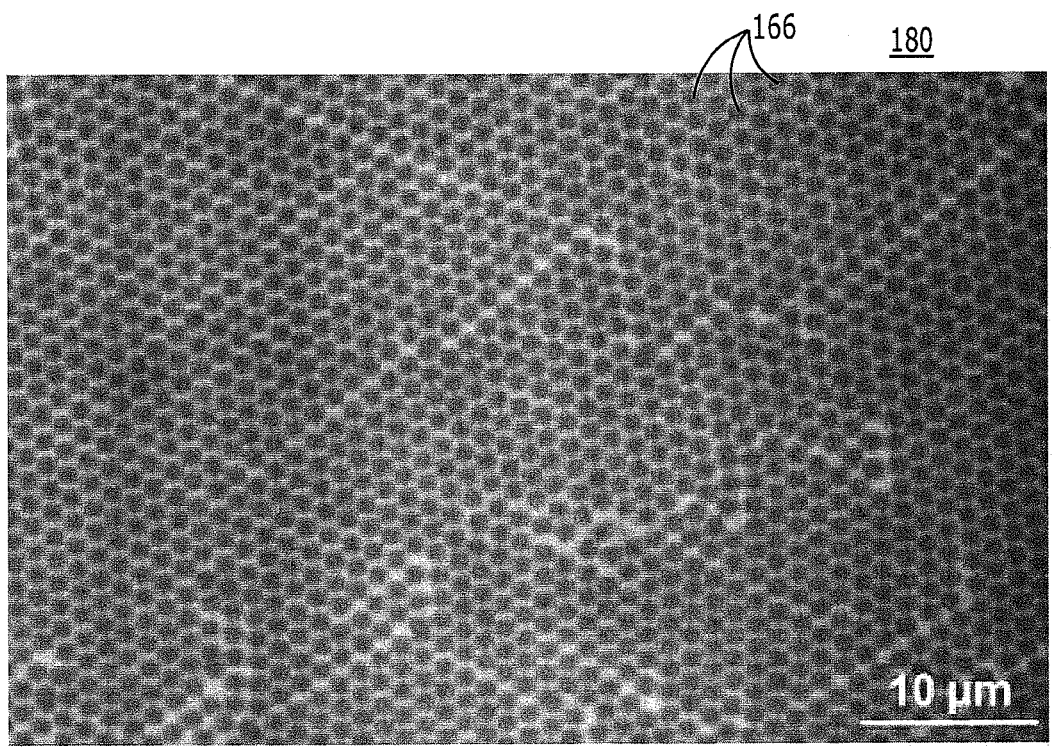
FIG. 4 is a confocal laser scanning microscopy image showing the microspheres of the microsphere template of FIG. 3.

This technique is advantageous in that it exploits the tendency of monosized sub-micrometer spheres to spontaneously arranged into a close-packed two-dimensional crystal. Further, strong capillary forces at the solid/air/water interface induce crystallization of microspheres into a two-dimensional array. FIG. 4 is a confocal laser scanning microscopy image 180 showing microspheres 166 of the microsphere template 162 of FIG. 3. These deposited microspheres have convex outer surfaces that serve as a template for forming the concave microstructures via soft-lithography.

The method further includes providing a light emitting device having a top emission surface 108, and depositing a layer 172 of fluid curable material, such as polydimethylsiloxane (PDMS), on the top emission surface 108, as shown in FIG. 2. By way of example, the fluid material layer may be deposited by spin-coating fluid material onto the light emitting device.

Optionally, the LED wafer may be pre-patterned with photoresist to cover the p- and n-metal contacts of the LEDs. The patterned photoresist may be subsequently used as a lift off mask for the curable material layer. The photoresist may be sufficiently thick to create a discontinuity in the subsequent curable layer to enable the lift off process.

The method further includes imprinting the layer 172 of fluid curable material by contacting the layer 172 of fluid curable material with the template 162 comprising the microspheres 166. This causes impressions forming concave microstructures in the curable material layer.

The method further includes heat treating the imprinted layer of fluid curable material 172 to provide a microlens layer 140 of cured material comprising a plurality of concave microstructures 150. This curing of the curable material fixes the concave microstructures in the microlens layer. After curing, the template 162 is removed from contact with the microlens layer 140 of cured material, leaving concave microstructures in the microlens layer, as shown in FIG. 2. The cured material on the metal contact regions may be lifted off to expose both p- and n-metal contact pads.

In use, optical emission may be generated by exciting the active region of the LED to produce optical emission through the microlens layer. The substantially-uniform surface roughness of the concave microstructures of the microlens layer on the top surface of the LED causes the light rays emanating from the QW to diffuse outwardly from the LEDs structure, leading to an increase in the light extraction efficiency of the LED.

A microlens layer in accordance with the present invention may be embodied in various types of optoelectronic devices including amplifiers, light emitting devices and edge emitting and surface emitting lasers that incorporate optical feedback to provide lasing action. The microlens layer may find application in solid state lighting, solid state displays, lasers, light emitting devices (LEDs), biomedical therapy and diagnostic devices, medical lasers, eye surgery devices and DVD lasers.

Thus, the present invention further provides an optoelectronic device comprising a multilayer semiconductor structure and a microlens layer disposed over the multilayer semiconductor, in which the microlens layer includes a plurality of concave microstructures. The multilayer semiconductor may include a GaN layer and an active region. The active region comprising at least one quantum well layer of InGaN and GaN, the electron quantum well layer and hole quantum well layer form a first quantum well stage. The active region comprises a plurality of quantum well stages adjacent to each other having the same structure as the first quantum well stage.

A method for making an optoelectronic device includes providing such a multilayer semiconductor structure, and providing a microlens layer including a plurality of concave microstructures over the multilayer semiconductor. The microlens layer may be formed over the multilayer semiconductor. The microlens layer may be formed using the imprinting method described herein.

The present invention further provides a method for generating optical emission from an optoelectronic device. The method includes providing a GaN layer and an active region, providing a microlens layer comprising a plurality of concave microstructures over the active region and exciting the active region to produce optical emission through the microlens layer. The microlens layer may be formed over the multilayer semiconductor. The microlens layer may be formed using the imprinting method described herein. The active region may include at least one quantum well layer of InGaN and GaN, wherein the electron quantum well layers and hole quantum well layer form a first quantum well stage. The active region may include a plurality of quantum well stages adjacent to each other having the same structure as the first quantum well stage.

EXAMPLES

In these Examples, a monolayer of $SiO_2$ microspheres was first deposited on a glass slide using the low-cost rapid convective deposition technique, consistent with the schematic of the rapid convective deposition technique shown in FIG. 2. The deposition blade 170 and the glass slide 162 forms a wedge-shaped corner. 10 μL of the monosized $SiO_2$ colloidal suspension was injected to a corner between the deposition blade 170 and substrate 162. The deposition blade was then swept across the glass slide with a linear motor. Deposition speed was varied to optimize deposition of a monolayer $SiO_2$ microspheres. A confocal laser scanning micrograph (CLSM) of the monolayer $SiO_2$ microsphere arrays on the glass substrate is shown in FIG. 4.

To form the concave microstructures on top of the LED structure, in this example the LED wafer was pre-patterned with 3.6 μm thick photoresist (PR 1813) to cover the p- and n-metal contacts of the LEDs. The p-metal for the LEDs used in this experiment was Ni/Au (20/300 nm), and the n-metal was Ti/Au (20/300 nm). The patterned photoresist was used as a lift off mask for PDMS. The photoresist is sufficiently thick to create a discontinuity in the subsequent PDMS layer to enable the lift off process.

A 3.0 μm layer of PDMS was then spin-coated on the LED wafer at 5000 rpm for 60 seconds. The PDMS-coated LED wafer was then imprinted by the monolayer $SiO_2$ microsphere arrays template with a pressure of 1.5 Newton/$m^2$. The PDMS-coated wafer was heated to a temperature of 80° C. for 45 minutes to cure the PDMS layer. The cured PDMS structure is stable up to a temperature of 200° C.

The $SiO_2$ microsphere arrays template was then removed, leaving concave microstructures arrays imprinted on the PDMS layer. The PDMS on the metal contact regions were then lifted off in acetone under ultrasonic agitation for 15 seconds, exposing both p- and n-metal contact pads. The controlled surface roughness from the PDMS concave arrays on the top surface of the LEDs allows the light rays emanating from the QW to diffuse out from the LEDs structure, leading to increase in the light extraction efficiency of the devices.

The InGaN QWs LEDs were grown by a metalorganic chemical vapor deposition reactor (MOCVD). The scanning electron microscopy (SEM) micrograph of the PDMS concave microstructures arrays fabricated on top of the LED structures is shown in FIG. 5. As shown in the SEM micrograph, the concave microstructures arrays are uniform and 2-D hexagonal close-packed arrays.

Figure 6A:
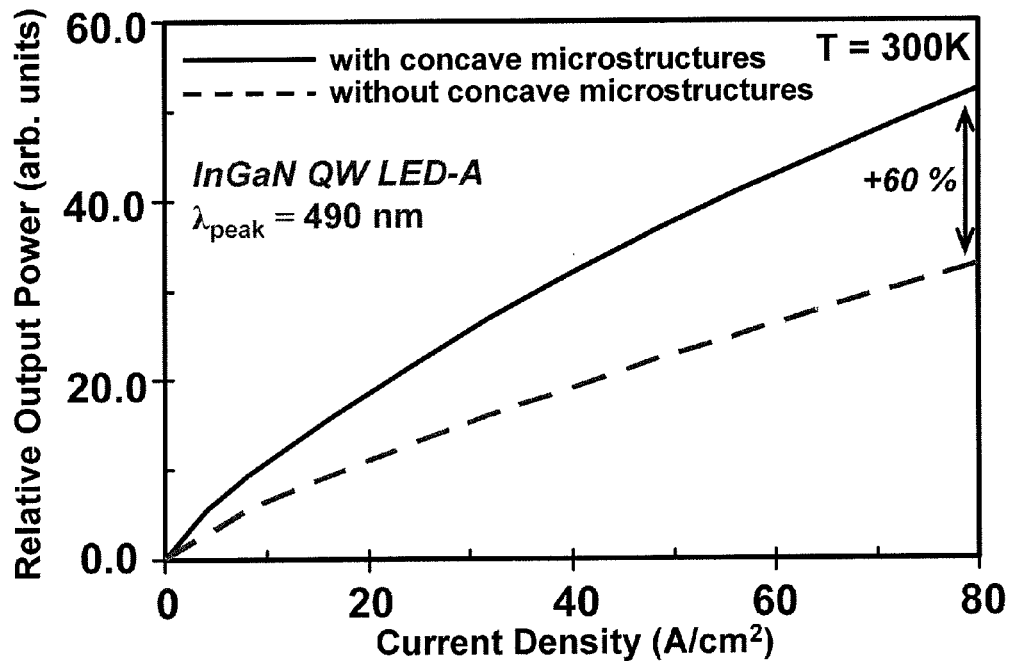
FIG. 6A is a graph of showing electroluminescence intensity for an InGaN QW LED with and without a 3 micron thick microlens layer including an array of 1 micron diameter concave microstructures (LED-A)
Figure 6B:
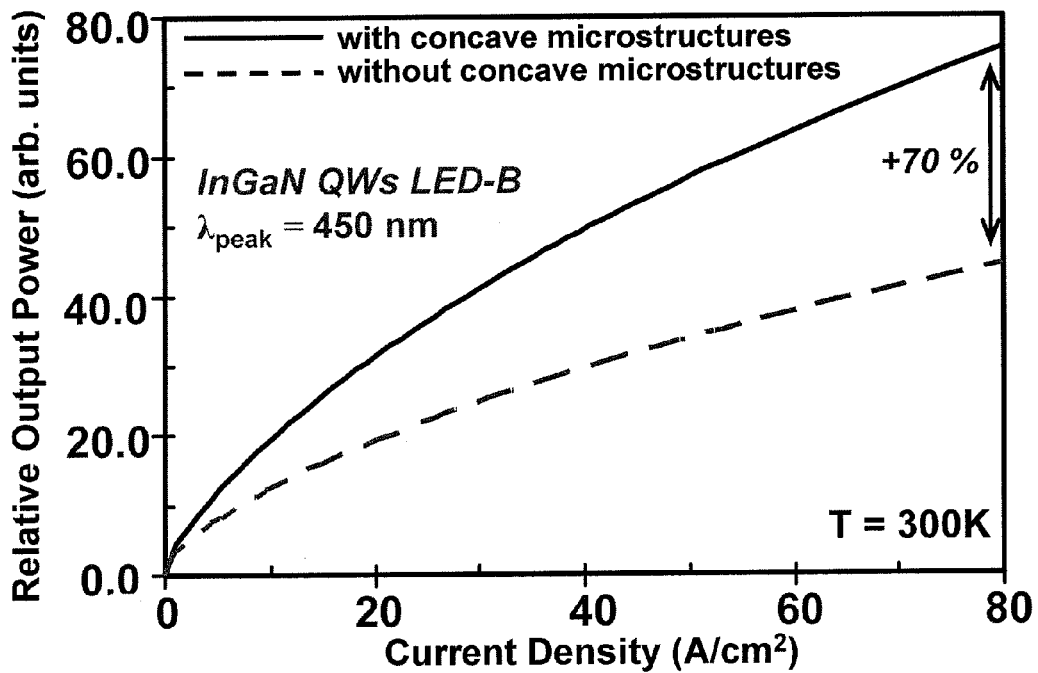
FIG. 6B is a graph of showing electroluminescence intensity for an InGaN QW LED with and without a 2 micron thick microlens layer including 1 micron diameter concave microstructures (LED-B)

Electroluminescence measurements were conducted on LEDs with and without PDMS concave microstructures arrays. The PDMS concave microstructures arrays were coated on two types of InGaN LEDs devices (LED-A and LED-B) with the same LED structure, but different emission wavelength. LED-A emission wavelength is 490 nm, and LED-B emission wavelength is 450 nm. The optical output power of the four period InGaN MQWs LEDs, with injection current density ranging from 0 to 80 A/$cm^2$ are shown in FIGS. 6A and 6B, respectively. FIG. 6A shows the optical output power of LED-A, and FIG. 6B shows the optical output power of LED-B. The LED devices were measured under continuous wave condition at room temperature. The on-wafer output power of the LEDs with an area of $1.25 \times 10^{-3}$ $cm^2$ was measured in a dark room for both coated and uncoated LEDs. LED-A was coated with 3.0 μm thick PDMS layer with $d_{concave}$=1.0 μm concave microstructures arrays, and LED-B was coated with 2.0 μm thick PDMS layer with $d_{concave}$=1.0 μm concave microstructures arrays. As shown in FIG. 6A, the coated LED-A exhibited a 1.60 times improvement in the output power as compared to that of the planar uncoated LED-A at injection current density of 80 A/$cm^2$. FIG. 6B shows that the coated LED-B exhibited a 1.70 times improvement in the output power as compared to that of the planar uncoated LED-B at injection current density of 80 A/cm².

Figure 7:
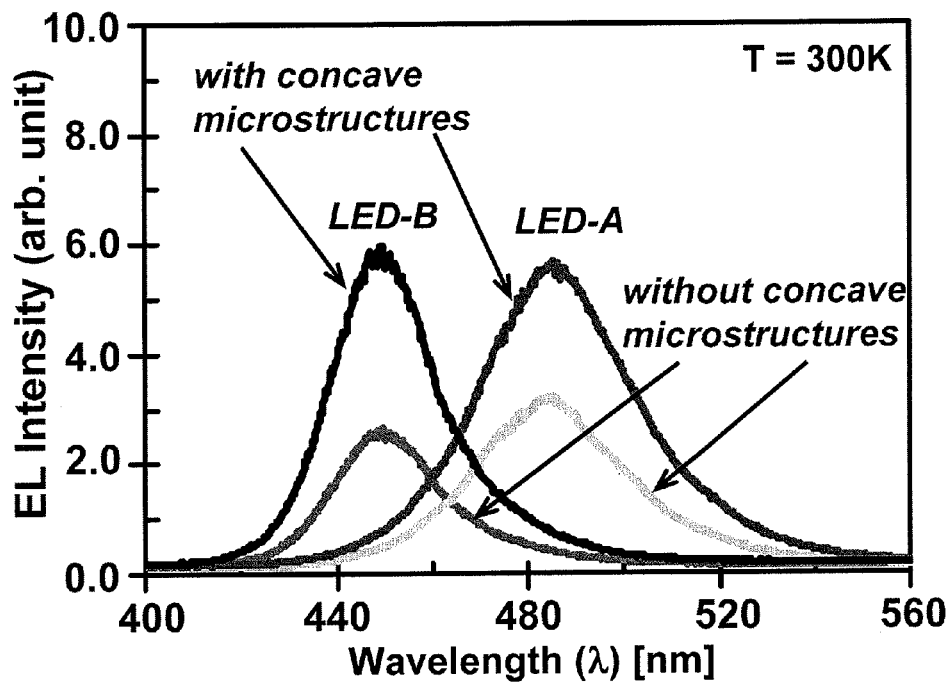
FIG. 7 is a graph showing electroluminescence intensity for LED-A and LED-B in comparison to an LED lacking concave microstructures.

The electroluminescence spectra of LED-A and LED-B at the injection current density level of 80 A/cm² are shown in FIG. 7. The LED-A emission wavelength is 490 nm, and LED-B emission wavelength is 450 nm. LED-A was coated with 3.0 μm thick PDMS layer with $d_{concave}$=1.0 μm concave microstructures arrays, and LED-B was coated with 2.0 μm thick PDMS layer with $d_{concave}$=1.0 μm concave microstructures arrays. With a thinner PDMS layer in LED-B, the LED emission surface is closer to the concave microstructures, thereby scattering more light out from the LED into free space. As shown in FIG. 7, LED-A and LED-B exhibited a 1.60 times, and 1.70 times improvement in the output power as compared to that of the planar uncoated LED, respectively.

Micrograph images were taken of the LED-B device operating at a current injection level of 100 mA without any coating, and with 2.0 μm thick PDMS with $d_{concave}$=1.0 μm concave microstructures arrays, respectively. The photomicrographs were taken with the same camera setting with f-number f/2.8 and shutter speed of 1/160 of a second. It was clearly observed that higher intensity light emission is coupled out in the top emitting InGaN QWs LED coated with the PDMS concave microstructures arrays.

Figure 8:
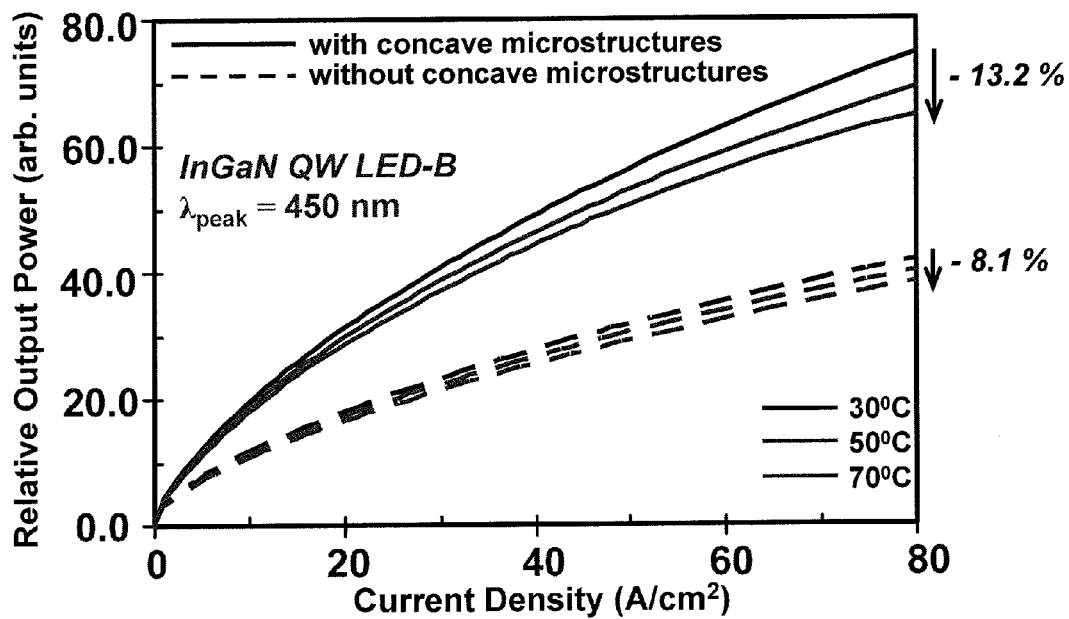
FIG. 8 is a graph showing electroluminescence intensity for LED-B with and without a 2 micron thick microlens layer, for a range of operating temperatures.

The PDMS layer is a polymer that is non-conducting, with a thermal conductivity value of 0.14 W/mK. This is relatively low compared to GaN, which has a thermal conductivity of 170 W/mK. To study the effect of the PDMS layer on LEDs device performance operating at high temperature, the optical output power as a function of injected current density of planar LEDs and LEDs employing PDMS-based concave microstructures arrays were measured on a temperature controlled testing stage. The testing stage temperature was varied from 30° C., 50° C., up to 70° C., and the output power was measured for uncoated and coated LED-B emitting at $\lambda_{peak}$=450 nm. FIG. 8 shows the output power of the LED-B with 2.0 μm thick PDMS layer with $d_{concave}$=1.0 μm concave microstructures arrays and uncoated LEDs at different temperatures. As the testing temperature increased from 30° C. to 70° C., the output power of the uncoated LED-B and PDMS coated LED-B reduces by 8.1% and 13.2%, respectively, for injection current density at 80 A/cm². Though the PDMS coated LED-B exhibit a drop of output power by 5.1% more compared to uncoated LED-B, the output power enhancement for PDMS coated LED-B was 70% at room temperature due to light extraction efficiency enhancement from the use of PDMS concave microstructures arrays.

While the present invention has been particularly shown and described with reference to the preferred mode as illustrated in the drawing, it will be understood by one skilled in the art that various changes in detail may be effected therein without departing from the spirit and scope of the invention as defined by the claims.

What is claimed is:

1. A light emitting device comprising:
   at least one n-type layer;
   at least one p-type layer disposed adjacent said at least one n-type layer; and
   a microlens layer disposed adjacent said at least one p-type layer, said microlens layer comprising a plurality of concave microstructures.

2. The light-emitting device of claim 1, wherein said plurality of concave microstructures are arranged in a substantially uniform array.

3. The light-emitting device of claim 1, wherein said plurality of concave microstructures are arranged in a plurality of close-packed hexagonal arrays.

4. The light emitting device of claim 1, wherein each of said plurality of concave microstructures has a maximum diameter measuring approximately 1 micron in diameter.

5. The light emitting device of claim 1, wherein said microlens layer comprises polydimethylsiloxane (PDMS).

6. The light emitting device of claim 5, wherein said microlens layer is formed by imprinting fluid PDMS with a template comprising a plurality of microsphere crystals, and curing the imprinted PDMS.

7. The light emitting device of claim 6, wherein said template comprises an array of $SiO_2$ microsphere crystals.

8. The light emitting device of claim 1, wherein the microlens layer is deposited on a top emission surface of an InGaN quantum well.

9. The light emitting device of claim 8, wherein InGaN quantum well comprises a quantum well active region comprising a GaN layer sandwiched between two InGaN layers.

10. A light emitting device comprising:
    a substrate;
    a first contact layer disposed over said substrate, said first contact layer comprising a GaN-based material having a first conduction type;
    an active layer disposed over said first contact layer, said active layer comprising at least one GaN-based material;
    a second contact layer disposed over said active layer, said second contact layer comprising a GaN-based material having a second conduction type opposite to the first conduction type; and
    a microlens layer disposed over said second contact layer, said microlens layer comprising a plurality of concave microstructures.

11. The light emitting device of claim 10, wherein said active region comprises multiple. InGaN—GaN pairs of quantum well layers.

12. The light emitting device of claim 10, wherein each of said plurality of concave microstructures has a maximum diameter within a range of from about 0.05 micron up to about 4 microns.

13. The light emitting device of claim 10, wherein each of said plurality of concave microstructures has a maximum diameter within a range of from about 0.5 micron up to about 1 micron.

14. An optoelectronic device comprising:
    a multilayer semiconductor structure comprising a GaN layer and an active region, the active region comprising at least one quantum well layer of InGaN and at least one quantum well layer of GaN, and wherein electron quantum well layers and a hole quantum well layer together form a quantum well stage, and wherein the active region comprises a plurality of quantum well stages adjacent to each other; and
    a microlens layer disposed over the multilayer semiconductor, said microlens layer comprising a plurality of concave microstructures.

* * * * *